US012751023B2

(12) United States Patent
Lao et al.

(10) Patent No.: US 12,751,023 B2
(45) Date of Patent: Sep. 29, 2026

(54) SEMICONDUCTOR DEVICE

(71) Applicant: Vanguard International Semiconductor Corporation, Hsinchu (TW)

(72) Inventors: Chung-Ren Lao, Taichung City (TW); Hsiao-Ying Yang, Taichung City (TW); Hsing-Chao Liu, Hsinchu County (TW); Hsueh-Chun Liao, Hsinchu County (TW); Ching-Chung Chen, Penghu County (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 316 days.

(21) Appl. No.: 18/754,114

(22) Filed: Jun. 25, 2024

(65) Prior Publication Data

US 2025/0393224 A1 Dec. 25, 2025

(51) Int. Cl.

*H10D 8/60* (2025.01)
*H10D 8/01* (2025.01)
*H10D 62/10* (2025.01)

(52) U.S. Cl.

CPC ............... *H10D 8/60* (2025.01); *H10D 8/051* (2025.01); *H10D 62/115* (2025.01)

(58) Field of Classification Search

CPC .. H10D 62/106; H10D 62/107; H10D 62/115; H10D 62/126; H10D 62/129; H10D 62/8325; H10D 64/111; H10D 64/23; H10D 8/051; H10D 8/60

See application file for complete search history.

(56) References Cited

U.S. PATENT DOCUMENTS

| | | | | |
|---|---|---|---|---|
| 2014/0061731 A1* | 3/2014 | Chen | .................... | H10D 30/051 257/272 |
| 2023/0290884 A1* | 9/2023 | Li | ............................ | H10D 8/00 |
| 2024/0178328 A1* | 5/2024 | Wu | ...................... | H10D 62/115 |
| 2025/0311398 A1* | 10/2025 | Kim | ....................... | H10D 30/83 |

FOREIGN PATENT DOCUMENTS

| | | |
|---|---|---|
| TW | 201308647 A1 | 2/2013 |
| TW | 202002307 A | 1/2020 |
| TW | 202412324 A | 3/2024 |

* cited by examiner

*Primary Examiner* — Shahan Ur Rahaman
(74) *Attorney, Agent, or Firm* — Winston Hsu

(57) ABSTRACT

A semiconductor device includes a first well region disposed in a substrate and a first doped region buried in the first well region. The first doped region includes a middle portion and a peripheral portion. The first well region includes a continuous block directly above the middle portion. A second doped region is disposed in the first well region and directly above the peripheral portion. A third doped region is disposed in the first well region. A first isolation structure is located between the second doped region and the third doped region. An anode electrode is disposed above the substrate and electrically connected to the continuous block of the first well region. A cathode electrode is disposed above the substrate and electrically connected to the third doped region.

15 Claims, 10 Drawing Sheets

SEMICONDUCTOR DEVICE

BACKGROUND OF THE INVENTION

1. Field of the Invention

The present disclosure relates generally to semiconductor devices, and more particularly to semiconductor devices for Schottky barrier diodes.

2. Description of the Prior Art

A Schottky barrier diode (SBD) is a semiconductor device using Schottky barrier characteristics of a metal-semiconductor junction. When the SBD is forward biased, i.e., a positive voltage is applied to the anode and a negative voltage is applied to the cathode, the carriers are conducted in the SBD. When the SBD is reverse biased, i.e., a negative voltage is applied to the anode and a positive voltage is applied to the cathode, the carriers are not conducted easily in the SBD. Therefore, the SBD has a rectifying effect of one-way conduction. Since the Schottky barrier is lower than the junction barrier of P-type and N-type semiconductors, compared with PN junction diodes, Schottky barrier diodes have lower turn on voltage and lower voltage drop under forward bias. Moreover, Schottky barrier diodes have very fast switching speed and are suitable for applications with low power consumption, high current and high switching speed.

However, Schottky barrier diodes have low withstand voltage and large leakage current under reverse bias. Therefore, the current Schottky barrier diodes still cannot fully satisfy the requirements in all aspects.

SUMMARY OF THE INVENTION

In view of this, the present disclosure provides a semiconductor device for a Schottky barrier diode (SBD), which uses the layout of a P-type semiconductor region at an anode end to increase the area and the proportion of an N-type semiconductor region, thereby enhancing the on-state current of the SBD under forward bias. Moreover, the leakage current of the SBD under reverse bias is suppressed, so that the off-state leakage current of the SBD is within an acceptable range. In addition, the breakdown voltage of the SBD under reverse bias is increased, thereby improving the electrical performances of the SBD.

According to an embodiment of the present disclosure, a semiconductor device is provided and includes a substrate, a first well region, a first doped region, a second doped region, a third doped region, a first isolation structure, an anode electrode, and a cathode electrode. The first well region has a first conductivity type and is disposed in the substrate. The first doped region has a second conductivity type and is buried in the first well region. The first doped region includes a middle portion and a peripheral portion, and the first well region includes a continuous block located directly above the middle portion. The second doped region having the second conductivity type is disposed in the first well region and located directly above the peripheral portion of the first doped region. The third doped region having the first conductivity type is disposed in the first well region. The first isolation structure is disposed in the first well region and located between the second doped region and the third doped region. The anode electrode is disposed above the substrate and electrically connected to the continuous block of the first well region. The cathode electrode is disposed above the substrate and electrically connected to the third doped region.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Aspects of the present disclosure are best understood from the following detailed description when read with the accompanying figures. It is noted that, in accordance with the standard practice in the industry, various features may not be drawn to scale. In fact, the dimensions of the various features may be arbitrarily increased or reduced for clarity of discussion.

DETAILED DESCRIPTION

Figure 1:
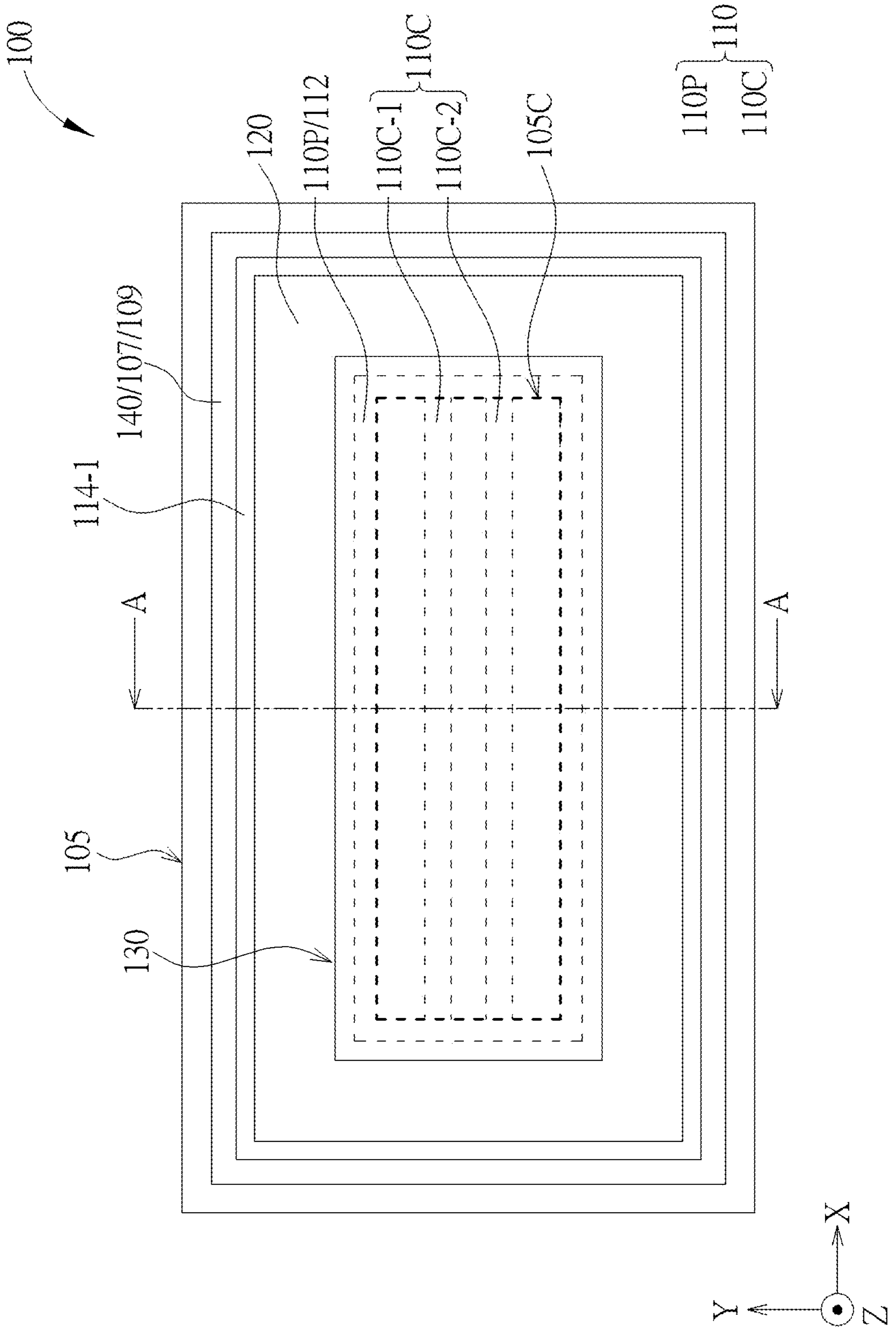
FIG. 1 is a schematic top view of a semiconductor device according to an embodiment of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "under," "lower," "over," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as "below" and/or "beneath" other elements or features would then be oriented "above" and/or "over" the other elements or features. The apparatus may be otherwise oriented (rotated 90 degrees or at other orientations) and the spatially relative descriptors used herein may likewise be interpreted accordingly.

It is understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first," "second," and other numerical terms when used herein do not imply a sequence or order unless clearly indicated by the context. Thus, a first element, component, region, layer and/or section discussed below could be termed a second element, component, region, layer and/or section without departing from the teachings of the embodiments.

As disclosed herein, the term "about" or "substantial" generally means within 20%, 10%, 5%, 3%, 2%, 1%, or 0.5% of a given value or range. Unless otherwise expressly specified, all of the numerical ranges, amounts, values and percentages disclosed herein should be understood as modified in all instances by the term "about" or "substantial". Accordingly, unless indicated to the contrary, the numerical parameters set forth in the present disclosure and attached claims are approximations that can vary as desired.

Furthermore, as disclosed herein, the terms "coupled to" and "electrically connected to" include any directly and indirectly electrical connecting means. Therefore, if it is described in this document that a first component is coupled or electrically connected to a second component, it means that the first component may be directly connected to the second component, or may be indirectly connected to the second component through other components or other connecting means.

Although the disclosure is described with respect to specific embodiments, the principles of the disclosure, as defined by the claims appended herein, can obviously be applied beyond the specifically described embodiments of the disclosure described herein. Moreover, in the description of the present disclosure, certain details have been left out in order to not obscure the inventive aspects of the disclosure. The details left out are within the knowledge of a person having ordinary skill in the art.

The present disclosure relates to a semiconductor device for a Schottky barrier diode (SBD), which uses the layout of a P-type semiconductor region at an anode end to increase the area and the proportion of an N-type semiconductor region, thereby enhancing the on-state current of the SBD. Moreover, the P-type semiconductor region at the anode end also suppresses the leakage current under reverse bias, so that the off-state leakage current of the SBD is within an acceptable range. In addition, the semiconductor devices of the present disclosure increase the breakdown voltage under reverse bias. Therefore, according to embodiments of the present disclosure, the overall electrical performances of the SBD are improved, which includes increasing the on-state current, suppressing the off-state leakage current, and increasing the breakdown voltage under reverse bias.

FIG. 1 is a schematic top view of a semiconductor device 100 according to an embodiment of the present disclosure. In order to make the figure concise and easy to understand, only some features of the semiconductor device are shown in FIG. 1. The other features of the semiconductor device may refer to FIG. 2, which shows a schematic cross-sectional view of the semiconductor device 100. As shown in FIG. 1, the semiconductor device 100 includes a first well region 105 having a first conductivity type, such as an N-type well region. A first doped region 110 having a second conductivity type, such as a P-type doped region, is buried in the first well region 105. The first doped region 110 includes a middle portion 110C and a peripheral portion 110P. When viewed from a top view, the peripheral portion 110P is an annular block, such as a rectangular annular block, and the middle portion 110C is an elongated block. The annular block of the peripheral portion 110P surrounds the elongated block of the middle portion 110C, and two ends of the elongated block are respectively connected to two sides of the annular block. In addition, the elongated block of the middle portion 110C may include multiple strips, such as two strips 110C-1 and 110C-2 shown in FIG. 1, but not limited thereto. The middle portion 110C may include other number of strips. Two ends of each of the strips 110C-1 and 110C-2 are respectively connected to two sides of the annular block of the peripheral portion 110P. In one embodiment, the long axis directions of the two strips 110C-1 and 110C-2 are parallel to each other. In addition, the semiconductor device 100 includes a second doped region 112 having the second conductivity type, such as a P-type doped region, disposed in the first well region 105, and located directly above the peripheral portion 110P of the first doped region 110. When viewed from a top view, the second doped region 112 is an annular block, such as a rectangular annular block. In one embodiment, in the vertical projection direction, the second doped region 112 may be completely overlapped with the peripheral portion 110P of the first doped region 110.

In addition, the first well region 105 includes a continuous block 105C located directly above the middle portion 110C of the first doped region 110. The first doped region 110 is not disposed in the continuous block 105C of the first well region 105. The second doped region 112 surrounds the continuous block 105C. The semiconductor device 100 further includes an anode electrode 130 disposed directly above the second doped region 112 and the continuous block 105C of the first well region 105. The anode electrode 130 is electrically connected to the continuous block 105C of the first well region 105. In one embodiment, when viewed from a top view, the anode electrode 130 is, for example, a rectangular block. Still refer to FIG. 1, the semiconductor device 100 further includes a conductive structure 120 disposed directly above the second doped region 112 and the peripheral portion 110P of the first doped region 110. In one embodiment, the conductive structure 120 is, for example, a polysilicon layer. When viewed from a top view, the conductive structure 120 is an annular block, such as a rectangular annular block. The annular block of the conductive structure 120 covers a portion of the second doped region 112 and exposes another portion of the second doped region 112. The anode electrode 130 covers a portion of the conductive structure 120. In addition, the semiconductor device 100 includes a third doped region 107 and a first heavily doped region 109 both disposed in the first well region 105. The third doped region 107 and the first heavily doped region 109 both have the first conductivity type. The third doped region 107 is, for example, an N-type well region, and the first heavily doped region 109 is, for example, an N-type heavily doped region. In addition, a cathode electrode 140 is disposed directly above both the third doped region 107 and the first heavily doped region 109, and the cathode electrode 140 is electrically connected to both the first heavily doped region 109 and the third doped region 107. When viewed from a top view, in one embodiment, the cathode electrode 140 is, for example, an annular block, and the annular block of the cathode electrode 140 surrounds the rectangular block of the anode electrode 130 and the annular block of the conductive structure 120. In addition, when viewed from a top view, a portion of a first isolation structure 114-1 is located between the cathode electrode 140 and the conductive structure 120. The first isolation structure 114-1 is an annular block, such as a rectangular annular block.

Figure 2:
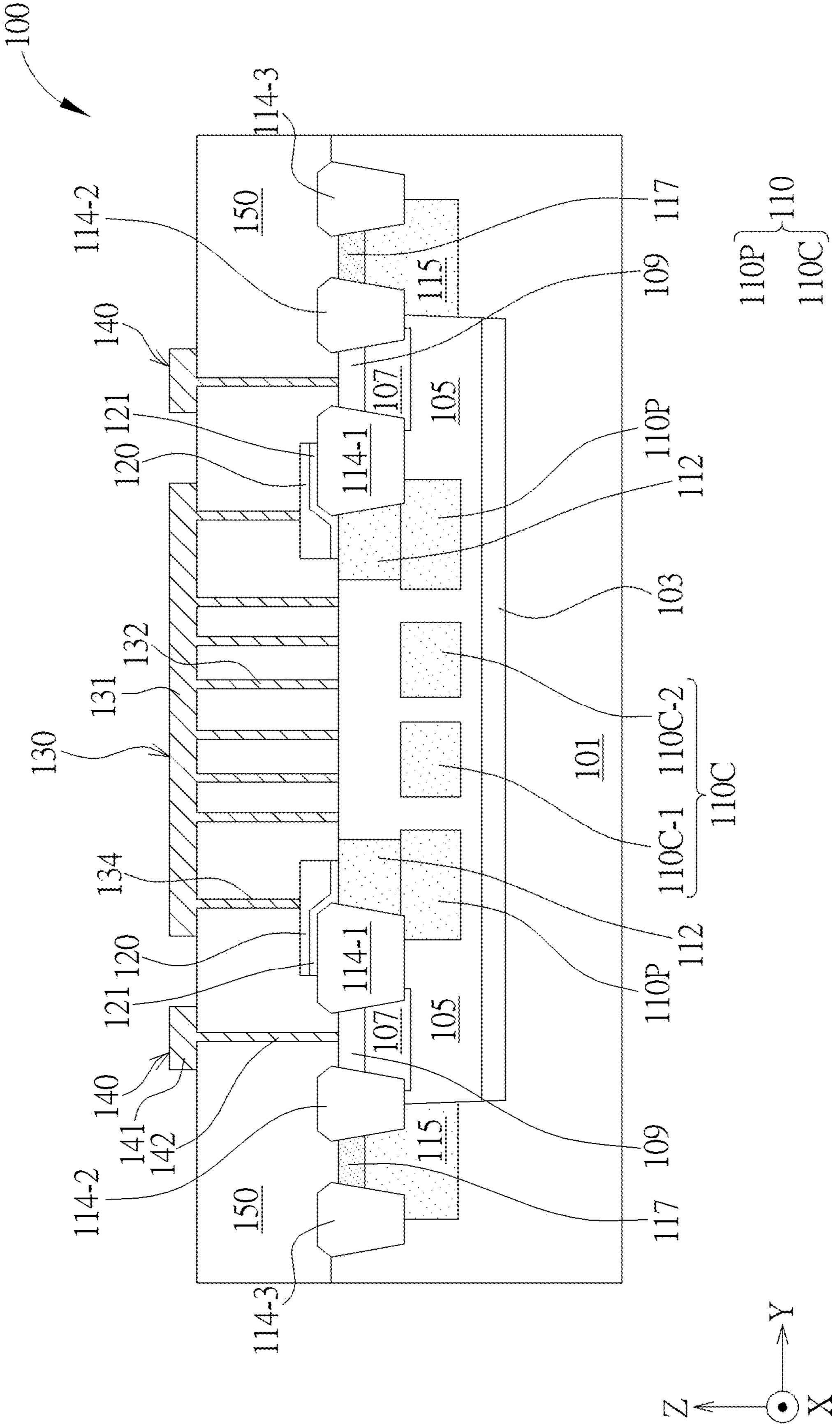
FIG. 2 is a schematic cross-sectional view of a semiconductor device according to an embodiment of the present disclosure, which is taken along a cross-sectional line A-A in FIG. 1.

FIG. 2 is a schematic cross-sectional view of the semiconductor device 100 according to an embodiment of the present disclosure, which is taken along a cross-sectional line A-A in FIG. 1. As shown in FIG. 2, the semiconductor device 100 includes a substrate 101. In some embodiments, the composition of the substrate 101 may be silicon (Si), germanium (Ge), silicon carbide (SiC), silicon germanium (SiGe) or a group III-V compound semiconductor, such as gallium nitride (GaN), gallium arsenide (GaAs), aluminum nitride (AlN), aluminum gallium nitride (AlGaN), indium aluminum gallium nitride (InAlGaN), indium gallium nitride (InGaN), aluminum gallium arsenide (AlGaAs), indium gallium arsenide (InGaAs), other similar compound semiconductors or a combination thereof. In addition, the substrate 101 may be a P-type or an N-type semiconductor substrate, or a semiconductor-on-insulator (SOI) substrate.

In one embodiment, the semiconductor device 100 includes a buried layer 103 having the first conductive type, such as an N-type buried layer (NBL), and the first well region 105 having the first conductive type, such as an N-type well region. Both the buried layer 103 and the first well region 105 are disposed in the substrate 101. The buried layer 103 is located directly below the first well region 105, and the buried layer 103 is in direct contact with the bottom surface of the first well region 105. The first doped region 110 having the second conductivity type, such as a P-type doped region, is buried in the first well region 105. The first doped region 110 includes the middle portion 110C and the peripheral portion 110P. The middle portion 110C includes multiple strips 110C-1 and 110C-2. The peripheral portion 110P and the middle portion 110C are located at the same depth position in the first well region 105. The bottom surface of the peripheral portion 110P and the bottom surface of the middle portion 110C are higher than the bottom surface of the first well region 105. Furthermore, in some embodiments, the doping concentration of the peripheral portion 110P and the doping concentration of the middle portion 110C are the same. The second doped region 112 having the second conductivity type, such as a P-type doped region, is also disposed in the first well region 105. The second doped region 112 is located directly above the peripheral portion 110P of the first doped region 110. The bottom surface of the second doped region 112 is in direct contact with the top surface of the peripheral portion 110P of the first doped region 110. In the vertical projection direction, the second doped region 112 is not overlapped with the middle portion 110C of the first doped region 110. In some embodiments, the doping concentration of the second doped region 112 may be higher than the doping concentration of the peripheral portion 110P of the first doped region 110. In other embodiments, the doping concentration of the second doped region 112 may be the same as or lower than the doping concentration of the peripheral portion 110P. Referring to FIG. 1 and FIG. 2, in the first doped region 110, the two ends of the middle portion 110C are connected to the peripheral portion 110P. The second doped region 112 is in direct contact with the peripheral portion 110P of the first doped region 110. The second doped region 112 and the peripheral portion 110P and the middle portion 110C of the first doped region 110 all have the second conductivity type and are connected to each other. Therefore, the second doped region 112 and the peripheral portion 110P and the middle portion 110C of the first doped region 110 jointly suppress the off-state leakage current under reverse bias.

Still referring to FIG. 2, the first well region 105 includes the continuous block 105C located directly above the middle portion 110C of the first doped region 110. According to some embodiments of the present disclosure, there is no first doped region 110 or other P-type doped regions disposed in the continuous block 105C of the first well region 105, thereby increasing the area and the proportion of an N-type semiconductor region used for conducting the on-state current. Therefore, the on-state current of the SBD is improved. In addition, the second doped region 112 surrounds the continuous block 105C of the first well region 105. The bottom surface of the continuous block 105C is in direct contact with the top surface of the middle portion 110C of the first doped region 110. The side surfaces of the continuous block 105C are in direct contact with the side surfaces of the second doped region 112. Moreover, some portions of the first well region 105 are located between the middle portion 110C and the peripheral portion 110P of the first doped region 110. A portion of the first well region 105 is located between the strips 110C-1 and 110C-2 of the middle portion 110C. The continuous block 105C of the first well region 105 is in direct contact with the top surfaces of the aforementioned portions of the first doped region 110. The semiconductor device 100 further includes the anode electrode 130 disposed above the substrate 101 and electrically connected to the continuous block 105C of the first well region 105. In one embodiment, the anode electrode 130 includes a metal layer 131 and multiple contact plugs 132. The metal layer 131 is disposed on the surface of an interlayer dielectric (ILD) layer 150, and the contact plugs 132 are disposed in the ILD layer 150. The compositions of the metal layer 131 and the contact plugs 132 are metals that can produce a Schottky contact, such as gold (Au), silver (Ag), platinum (Pt), tungsten (W), titanium (Ti), aluminum (Al), nickel (Ni), cobalt (Co) or a combination thereof. In some embodiments, the metal layer 131 and the contact plugs 132 have the same composition. The contact plugs 132 of the anode electrode 130 pass through the ILD layer 150 to be in contact with the continuous block 105C of the first well region 105. In addition, the semiconductor device 100 includes a conductive structure 120 and a dielectric layer 121 disposed directly above the second doped region 112. The dielectric layer 121 is located between the conductive structure 120 and the second doped region 112. The conductive structure 120 is electrically connected to the metal layer 131 of the anode electrode 130 through other contact plugs 134 in the ILD layer 150. In some embodiments, the conductive structure 120 is, for example, a polysilicon layer, and the dielectric layer 121 is, for example, a silicon oxide layer. The conductive structure 120 and the dielectric layer 121 may be fabricated together with gate electrodes and gate dielectric layers of other transistors. The conductive structure 120 is located directly above the second doped region 112 and electrically connected to the anode electrode 130, so that the conductive structure 120 provides an electric field dispersion effect under reverse bias, thereby enhancing the breakdown voltage under reverse bias.

In addition, the semiconductor device 100 includes a third doped region 107 having the first conductivity type, such as an N-type doped region, disposed in the first well region 105. The third doped region 107 surrounds the first doped region 110 and the second doped region 112. A first heavily doped region 109 having the first conductivity type, such as an N-type heavily doped region (N+), is disposed in the third doped region 107. The doping concentration of the first heavily doped region 109 is higher than the doping concentration of the third doped region 107. A cathode electrode 140 is disposed above the substrate 101. The cathode electrode 140 includes a metal layer 141 and contact plugs 142. The metal layer 141 is disposed on the surface of the ILD layer 150. The contact plugs 142 are disposed in the ILD layer 150 and pass through the ILD layer 150 to be in contact with the first heavily doped region 109, so that the cathode electrode 140 is electrically connected to the third doped region 107 and the first heavily doped region 109. In some embodiments, the composition of the cathode electrode 140 may be the same as the composition of the anode electrode 130. A first isolation structure 114-1 is disposed in the first well region 105 and located between the second doped region 112 and the third doped region 107 to electrically isolate the anode 1 from the cathode in the semiconductor device 100. In some embodiments, the first isolation structure 114-1 is, for example, a field oxide (FOX) layer or a shallow trench isolation (STI) structure.

Still referring to FIG. 2, the semiconductor device 100 further includes a second well region 115 having the second conductivity type, such as a P-type well region, disposed in the substrate 101. The second well region 115 abuts the side surfaces of the first well region 105 and surrounds the first well region 105. The bottom surface of the second well region 115 may be higher than the bottom surface of the first well region 105, and the top surface of the second well region 115 is higher than the top surface of the first doped region 110. In addition, a second heavily doped region 117 having the second conductivity type, such as a P-type heavily doped region (P+), is disposed in the second well region 115. The doping concentration of the second heavily doped region 117 is higher than that of the second well region 115. The second well region 115 and the second heavily doped region 117 may be electrically coupled to a bulk potential through other wires (not shown) on the ILD layer 150 and other contact plugs (not shown) in the ILD layer 150. In addition, a second isolation structure 114-2 is disposed in the substrate 101. The second isolation structure 114-2 is located between the third doped region 107 and the second well region 115, and surrounds the third doped region 107 to electrically isolate the cathode from the bulk terminal in the semiconductor device 100. Furthermore, a third isolation structure 114-3 is disposed in the substrate 101 and surrounds the second well region 115 to electrically isolate the semiconductor device 100 from other adjacent components. In some embodiments, the second isolation structure 114-2 and the third isolation structure 114-3 are, for example, field oxide (FOX) layers or shallow trench isolation (STI) structures.

When the SBD of the semiconductor device 100 is forward biased, the on-state current is mainly conducted through the first well region 105 having the first conductivity type such as the N-type. When the SBD of the semiconductor device 100 is reverse biased, a depletion region is generated between the first well region 105 having the first conductive type such as the N-type and the first doped region 110 and the second doped region 112 both having the second conductive type such as the P-type, and the depletion region has a pinch effect on the off-state leakage current. According to some embodiments of the present disclosure, there is no doped region of the second conductivity type such as the P-type disposed at the surface of the central region of the anode end of the SBD in the semiconductor device 100, that is, there is no doped region of the second conductivity type such as the P type disposed directly above the middle portion 110C of the first doped region 110. Moreover, the second doped region 112 surrounds the continuous block 105C of the first well region 105. In a comparative example, a doped region of the second conductivity type such as the P type is disposed directly above the middle portion 110C of the first doped region 110. Compared with the comparative example, the area of the first well region 105 used to conduct the on-state current in the embodiment of the present disclosure is increased, thereby providing more current paths to increase the on-state current of the SBD. Moreover, the first doped region 110 and the second doped region 112 in the embodiment of the present disclosure provide sufficient pinch effect on the off-state leakage current, so that the off-state leakage current level of the SBD in the semiconductor device 100 is within an acceptable range. Therefore, the overall performances of the SBD are effectively improved by the semiconductor devices of the present disclosure.

Figure 3:
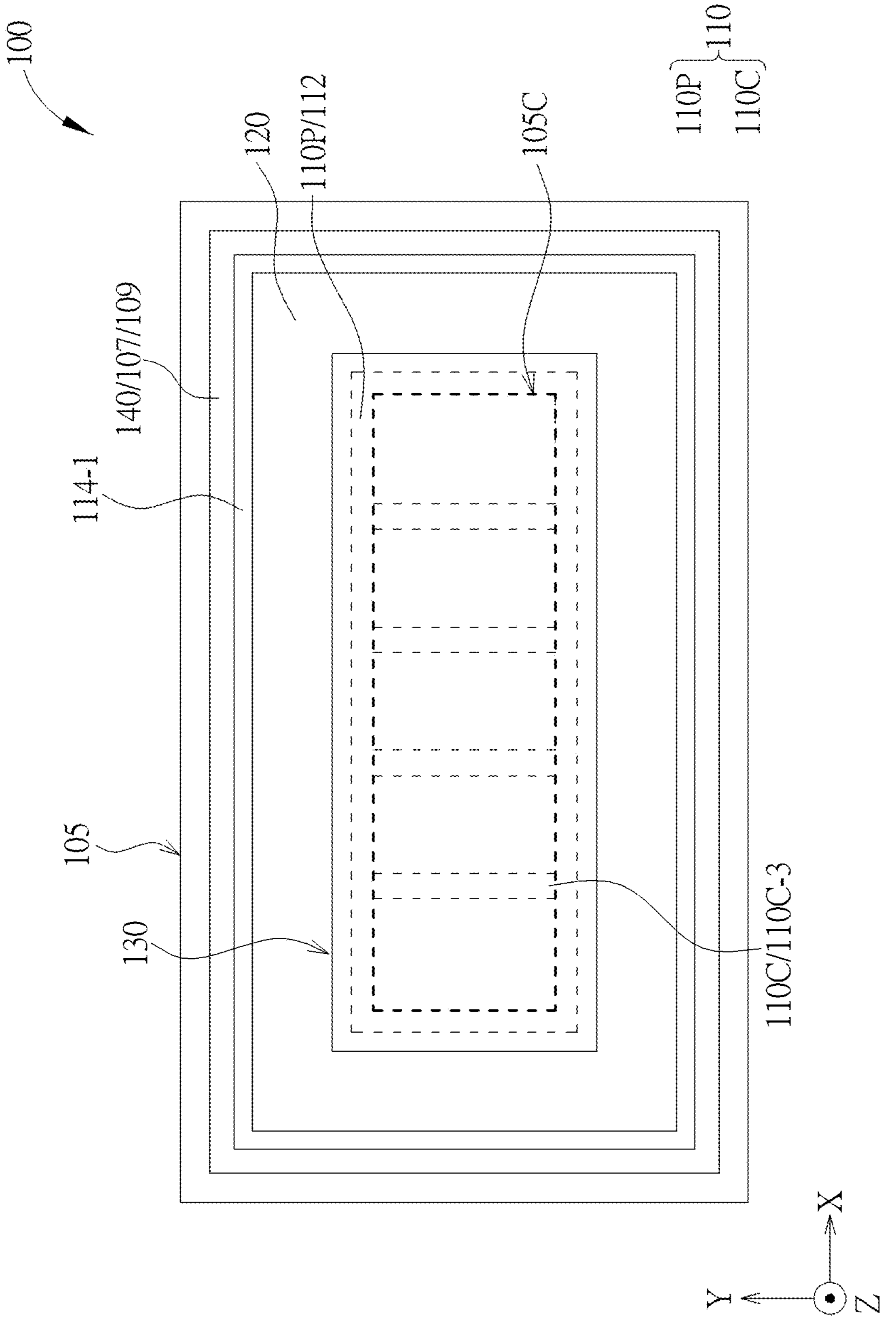
FIG. 3 is a schematic top view of a semiconductor device according to another embodiment of the present disclosure.

FIG. 3 is a schematic top view of a semiconductor device 100 according to another embodiment of the present disclosure. In the semiconductor device 100 of FIG. 3, the middle portion 110C of the first doped region 110 includes multiple strips 110C-3 spaced apart from each other. The long axis directions of these strips 110C-3 are extended along the Y-axis and parallel to each other. Two ends of each strip 110C-3 are respectively connected to two sides of the annular block of the peripheral portion 110P of the first doped region 110. The number of the strips 110C-3 may be adjusted according to the requirements and not limited to the number as shown in FIG. 3. In addition, the other features of the semiconductor device 100 in FIG. 3 may refer to the aforementioned descriptions of the semiconductor device 100 in FIG. 1, which will not be repeated here.

Figure 4:
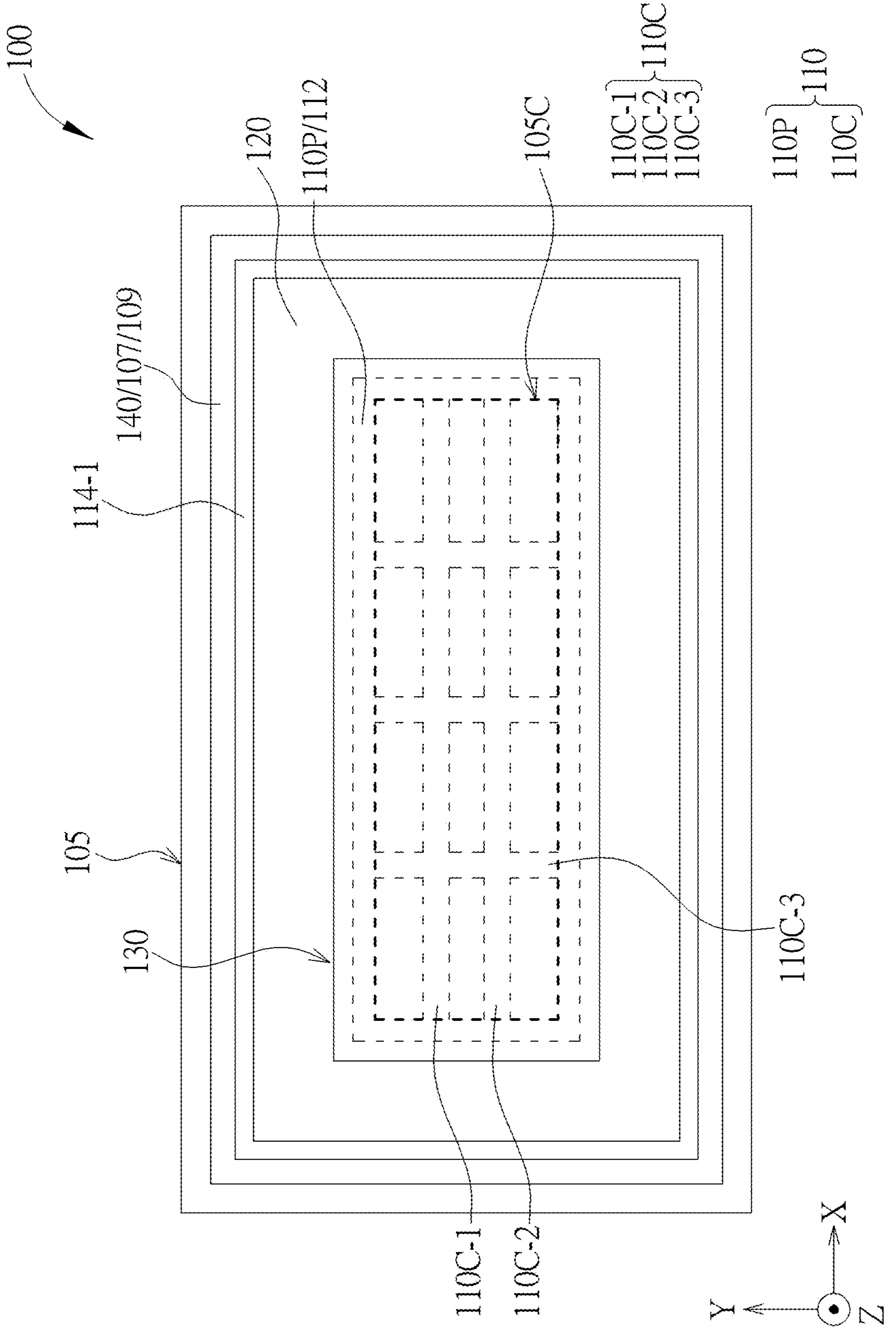
FIG. 4 is a schematic top view of a semiconductor device according to further another embodiment of the present disclosure.

FIG. 4 is a schematic top view of a semiconductor device 100 according to another embodiment of the present disclosure. In the semiconductor device 100 of FIG. 4, the middle portion 110C of the first doped region 110 includes multiple strips 110C-1, 110C-2 and 110C-3. The strips 110C-1 and 110C-2 are spaced apart from each other, and their long axis directions are extended along the X-axis and parallel to each other. The strips 110C-3 are also spaced apart from each other, and their long axis directions are extended along the Y-axis and parallel to each other. In addition, the long axis directions of the strips 110C-1 and 110C-2 and the long axis directions of the strips 110C-3 are perpendicular to each other. Two ends of each of the strips 110C-1 and 110C-2 are respectively connected to the left and right sides of the annular block of the peripheral portion 110P of the first doped region 110. Two ends of each strip 110C-3 are respectively connected to the upper and lower sides of the annular block of the peripheral portion 110P of the first doped region 110. The number of these strips 110C-1, 110C-2 and 110C-3 may be adjusted according to the requirements, and not limited to the number of the strips as shown in FIG. 4. The number of these strips 110C-1, 110C-2 and 110C-3 is based on both the pinch effect on the off-state leakage current and the increase in the on-state current. The other features of the semiconductor device 100 in FIG. 4 may refer to the aforementioned descriptions of the semiconductor device 100 in FIG. 1 and will not be repeated here.

Figure 5:
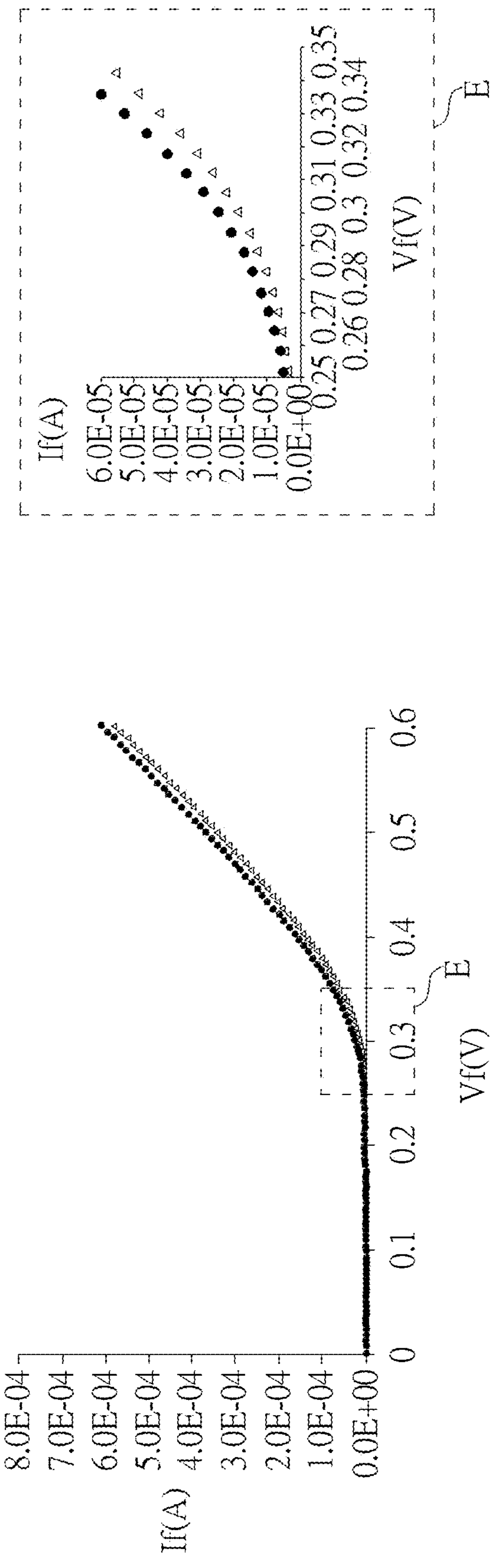
FIG. 5 shows characteristics of a forward current and a forward voltage of a semiconductor device according to an embodiment of the present disclosure and those of a semiconductor device of a comparative example, where both semiconductor devices are in an on-state, and an enlarged view of a framed area E in FIG. 5.

FIG. 5 shows characteristics of the forward current If changing with the forward voltage Vf of a semiconductor device according to an embodiment of the present disclosure and those of a semiconductor device of a comparative example, where both the semiconductor devices are in the on-state, and an enlarged view of the framed area E therein. In FIG. 5, the horizontal axis is the forward voltage Vf with a unit of volts (V), and the vertical axis is the forward current If with a unit of amperes (A). The embodiment is, for example, the semiconductor device 100 as shown in FIG. 1 and FIG. 2. The comparative example is a semiconductor device with an additional doped region of the second conductivity type such as the P type disposed in the semiconductor device 100 of FIG. 1 and FIG. 2. The comparative example is, for example, with two additional elongated P-type doped regions disposed directly above the strips 110C-1 and 110C-2 of the middle portion 110C of the first doped region 110, so that in the comparative example, the well region of the first conductivity type such as the N-type located at the surface of the central region of the anode end of the SBD is discontinuous. As shown in FIG. 5, under the same forward voltage Vf, the forward current If of the SBD of the embodiment is greater than the forward current If of the SBD of the comparative example. For example, when the forward voltage Vf is 0.3V, compared with the forward current If of the SBD in the comparative example, the forward current If of the SBD in the embodiment is increased by about 33.7%. This means that the on-state current of the SBD according to the embodiments of the present disclosure is effectively enhanced.

Figure 6:
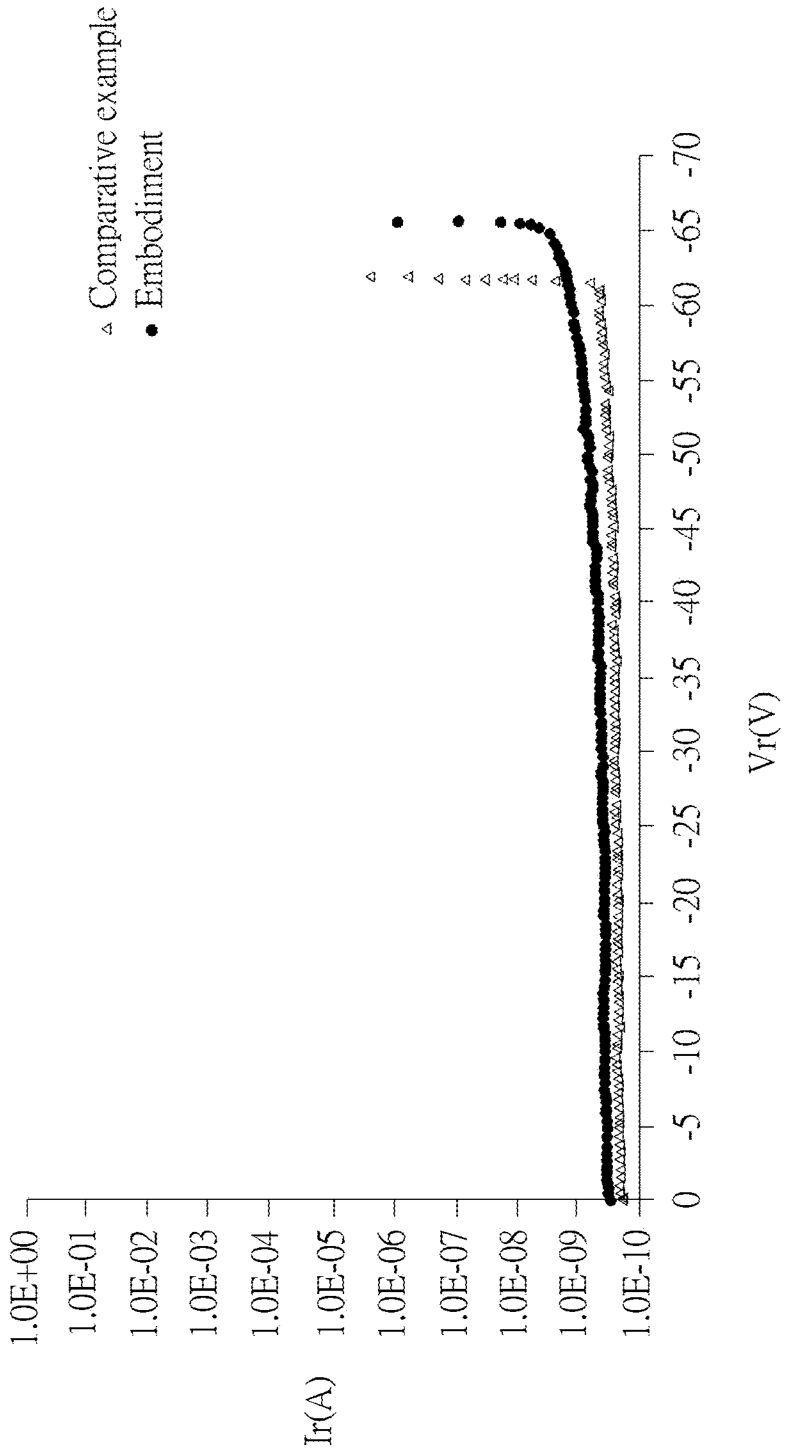
FIG. 6 shows characteristics of a reverse current and a reverse voltage of a semiconductor device according to an embodiment of the present disclosure and those of a semiconductor device of a comparative example, where both semiconductor devices are in an off-state.

FIG. 6 shows characteristics of the reverse current Ir changing with the reverse voltage Vr of a semiconductor device according to an embodiment of the present disclosure and those of a semiconductor device of a comparative example, where both the semiconductor devices are in the off-state. In FIG. 6, the horizontal axis is the reverse voltage Vr with a unit of volts (V), and the vertical axis is the reverse current Ir with a unit of amperes (A). The embodiment and the comparative example of FIG. 6 are the same as those of FIG. 5, and the details thereof may refer to the aforementioned description in FIG. 5, which will not be repeated here. As shown in FIG. 6, under the same reverse voltage Vr, compared with the reverse current Ir of the SBD in the comparative example, the reverse current Ir of the SBD in the embodiment is increased slightly. The reverse current Ir of the SBD of the embodiment is on the same level with that of the comparative example, which means that the SBD in the embodiment of the present disclosure can suppress the off-state leakage current within an acceptable range. In addition, as shown in FIG. 5 and FIG. 6, the ratio of the on-state current (Ion) to the off-state current (Ioff) of the SBD in the comparative example is about 7.2E4 and that of the SBD in the embodiment is about 5.4E4. This means that the semiconductor devices according to the embodiments of the present disclosure can suppress the off-state leakage current of the SBD within a reasonable range. Moreover, as shown in FIG. 6, the breakdown voltage of the SBD in the embodiment of the present disclosure is increased by about 3V compared to the breakdown voltage of the SBD in the comparative example. This means that the breakdown voltage of the SBD according to the embodiments of the present disclosure is slightly improved.

Figure 7:
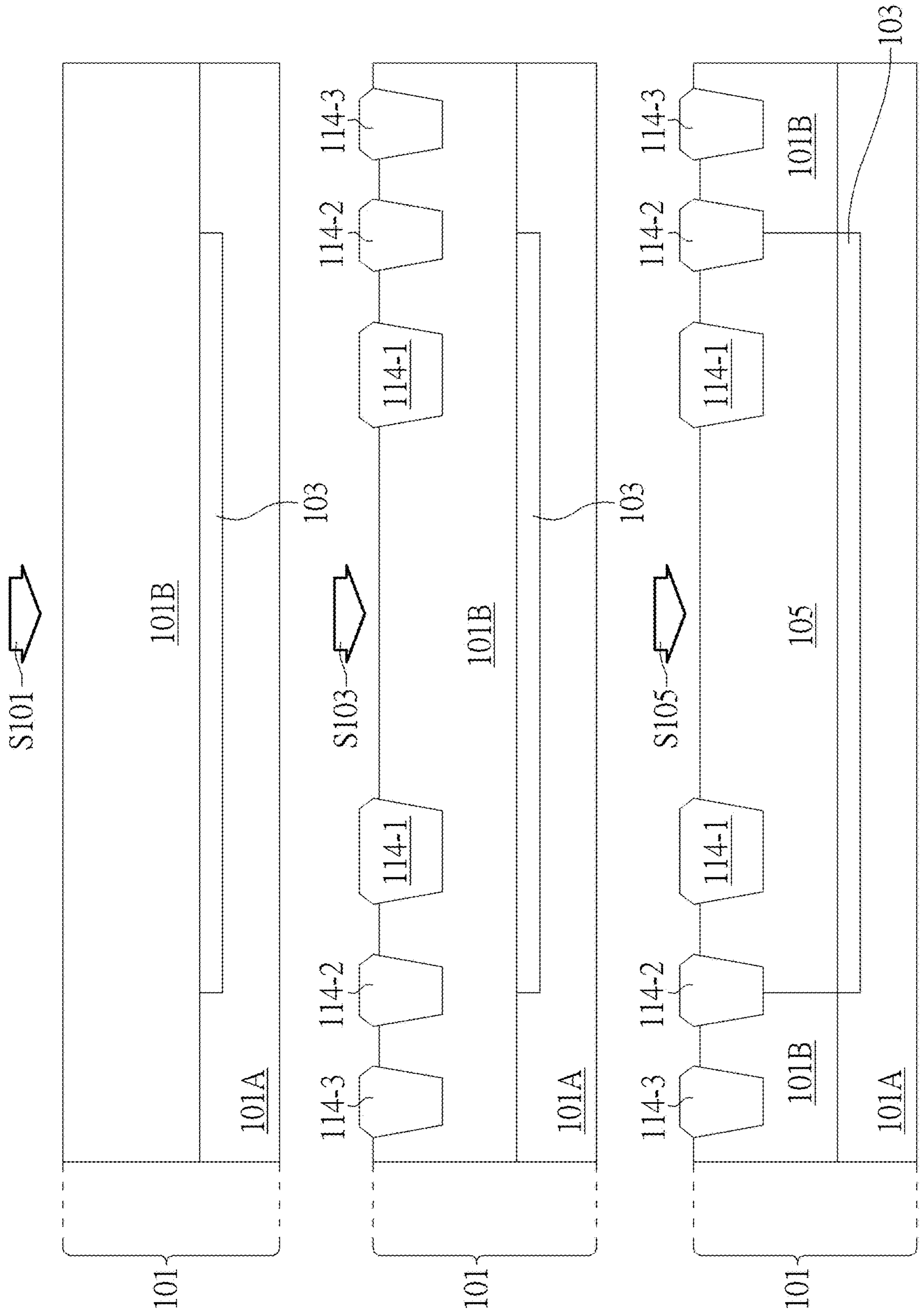
FIG. 7, FIG. 8, FIG. 9 and FIG. 10 are schematic cross-sectional views of some stages of a method of fabricating a semiconductor device according to another embodiment of the present disclosure.

FIG. 7, FIG. 8, FIG. 9 and FIG. 10 are schematic cross-sectional views of some stages of a method of fabricating a semiconductor device 100 according to another embodiment of the present disclosure. Referring to FIG. 7, in step S101, firstly, a semiconductor substrate 101A, for example, a silicon (Si) wafer, a silicon carbide (Sic) wafer, or a P-type semiconductor substrate is provided. Then, a buried layer 103 such as an N-type buried layer (NBL) is formed in the semiconductor substrate 101A by using a patterned patterned photoresist and an ion implantation process. Next, an epitaxial layer 101B is formed on the semiconductor substrate 101A by an epitaxial growth process, where the buried layer 103 is embedded in the semiconductor substrate 101A and the epitaxial layer 101B. The epitaxial layer 101B is, for example, a silicon (Si) epitaxial layer, a silicon carbide (SiC) epitaxial layer or a P-type semiconductor epitaxial layer. The semiconductor substrate 101A and the epitaxial layer 101B constitute a substrate 101.

Still referring to FIG. 7, in step S103, a first isolation structure 114-1, a second isolation structure 114-2 and a third isolation structure 114-3 are formed in the epitaxial layer 101B of the substrate 101, where the second isolation structure 114-2 surrounds the first isolation structure 114-1, and the third isolation structure 114-3 surrounds the second isolation structure 114-2. In one embodiment, the first isolation structure 114-1, the second isolation structure 114-2 and the third isolation structure 114-3 are all field oxide (FOX) layers, and these isolation structures may be formed simultaneously by using a patterned mask and a thermal oxidation process. In another embodiment, the first isolation structure 114-1, the second isolation structure 114-2 and the third isolation structure 114-3 are all shallow trench isolation (STI) structures, and these isolation structures may be formed simultaneously by etching the substrate to form shallow trenches, filling the shallow trenches with a dielectric material, and performing a chemical mechanical planarization (CMP) process.

Continuing to refer to FIG. 7, in step S105, a first well region 105 such as an N-type well region is formed in the epitaxial layer 101B of the substrate 101 by using a patterned mask such as a patterned photoresist and an ion implantation process. The first well region 105 is located directly above and in contact with the buried layer 103. In one embodiment, the width of the first well region 105 may be the same as the width of the buried layer 103. Furthermore, the second isolation structure 114-2 surrounds the first well region 105, and the first isolation structure 114-1 is located in the first well region 105.

Figure 8:
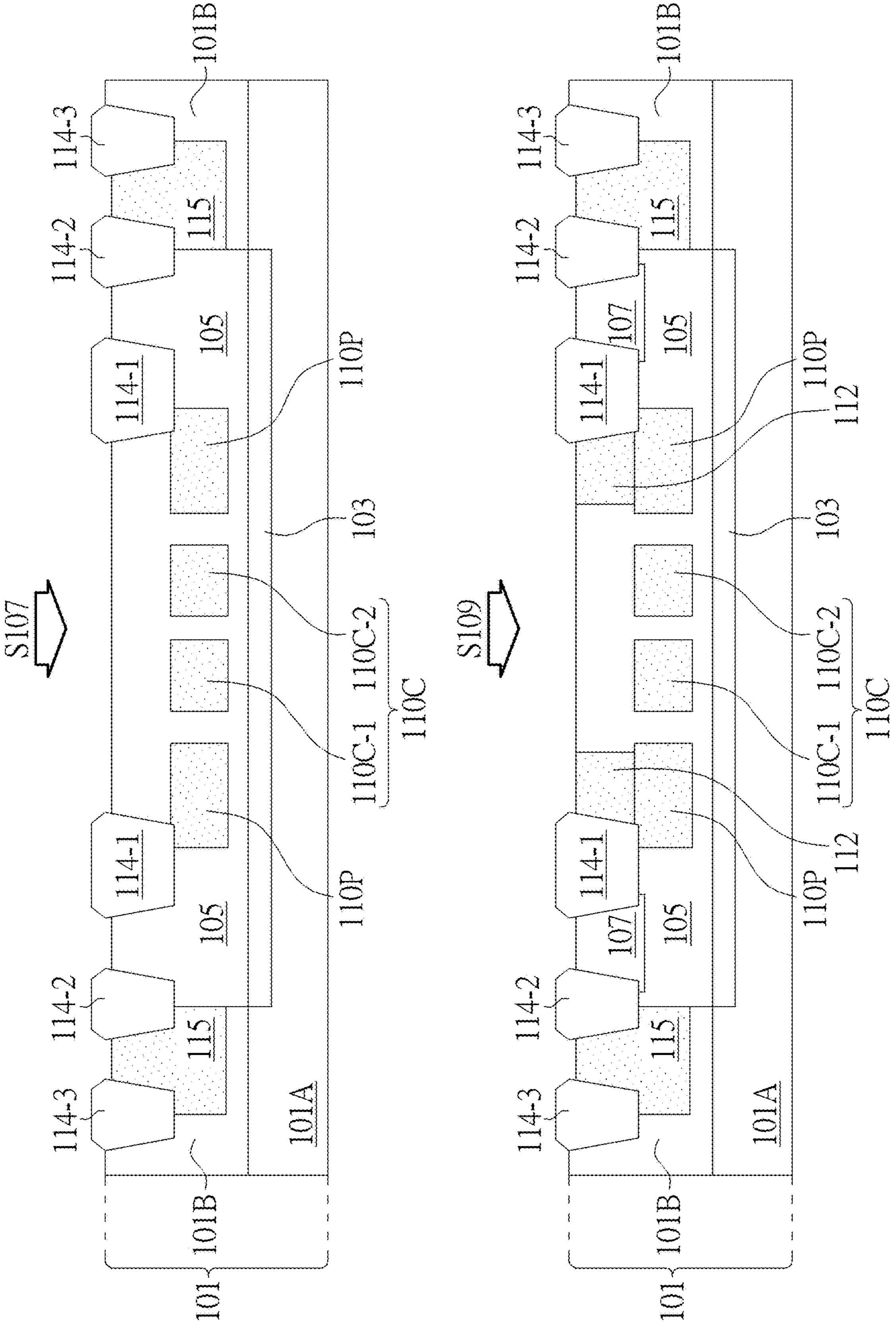

Next, referring to FIG. 8, in step S107, a first doped region 110 such as a P-type doped region is formed in the first well region 105 by using a patterned mask, for example, a patterned photoresist and an ion implantation process. The first doped region 110 is buried in the first well region 105 and includes an annular peripheral portion 110P and an elongated middle portion 110C having multiple strips 110C-1 and 110C-2. The first isolation structure 114-1 surrounds the first doped region 110 and is in direct contact with the peripheral portion 110P. In addition, a second well region 115 such as a P-type well region is formed in the epitaxial layer 101B of the substrate 101 by using another patterned mask, for example, a patterned photoresist and an ion implantation process. The second well region 115 surrounds and abuts the side surfaces of the first well region 105. The top surface of the second well region 115 is higher than the top surface of the first doped region 110. The bottom surface of the second well region 115 and the bottom surface of the first doped region 110 are both higher than the bottom surface of the first well region 105. In some embodiments, the doping concentration of the second well region 115 may be the same as the doping concentration of the first doped region 110, for example, both are about 1E12 atoms/$cm^2$ to about 1E13 atoms/$cm^2$. In addition, the third isolation structure 114-3 surrounds the periphery of the second well region 115, and the second isolation structure 114-2 is located between the first well region 105 and the second well region 115.

Still referring to FIG. 8, in step S109, a second doped region 112 such as a P-type doped region is formed in the first well region 105 by using a patterned mask, for example, a patterned photoresist and an ion implantation process. The second doped region 112 is located directly above the peripheral portion 110P of the first doped region 110, and the bottom surface of the second doped region 112 is in direct contact with the top surface of the peripheral portion 110P. In the vertical projection direction, the second doped region 112 may be completely overlapped with the peripheral portion 110P of the first doped region 110, and the second doped region 112 is not overlapped with the middle portion 110C of the first doped region 110. The first isolation structure 114-1 surrounds the periphery of the second doped region 112 and is in direct contact with the second doped region 112. In addition, a third doped region 107 such as an N-type doped region is formed in the first well region 105 by using another patterned mask, for example, a patterned photoresist and another ion implantation process. The third doped region 107 surrounds both the first doped region 110 and the second doped region 112, and the third doped region 107 is separated from both the first doped region 110 and the second doped region 112 by a distance. The first isolation structure 114-1 is located between the third doped region 107 and the second doped region 112. The top surface of the third doped region 107 is higher than the top surface of the first doped region 110, and the top surface of the third doped region 107 and the top surface of the second doped region 112 are on the same plane. In addition, the third doped region 107 is located between the first isolation structure 114-1 and the second isolation structure 114-2. The second well region 115 is located between the second isolation structure 114-2 and the third isolation structure 114-3.

Figure 9:
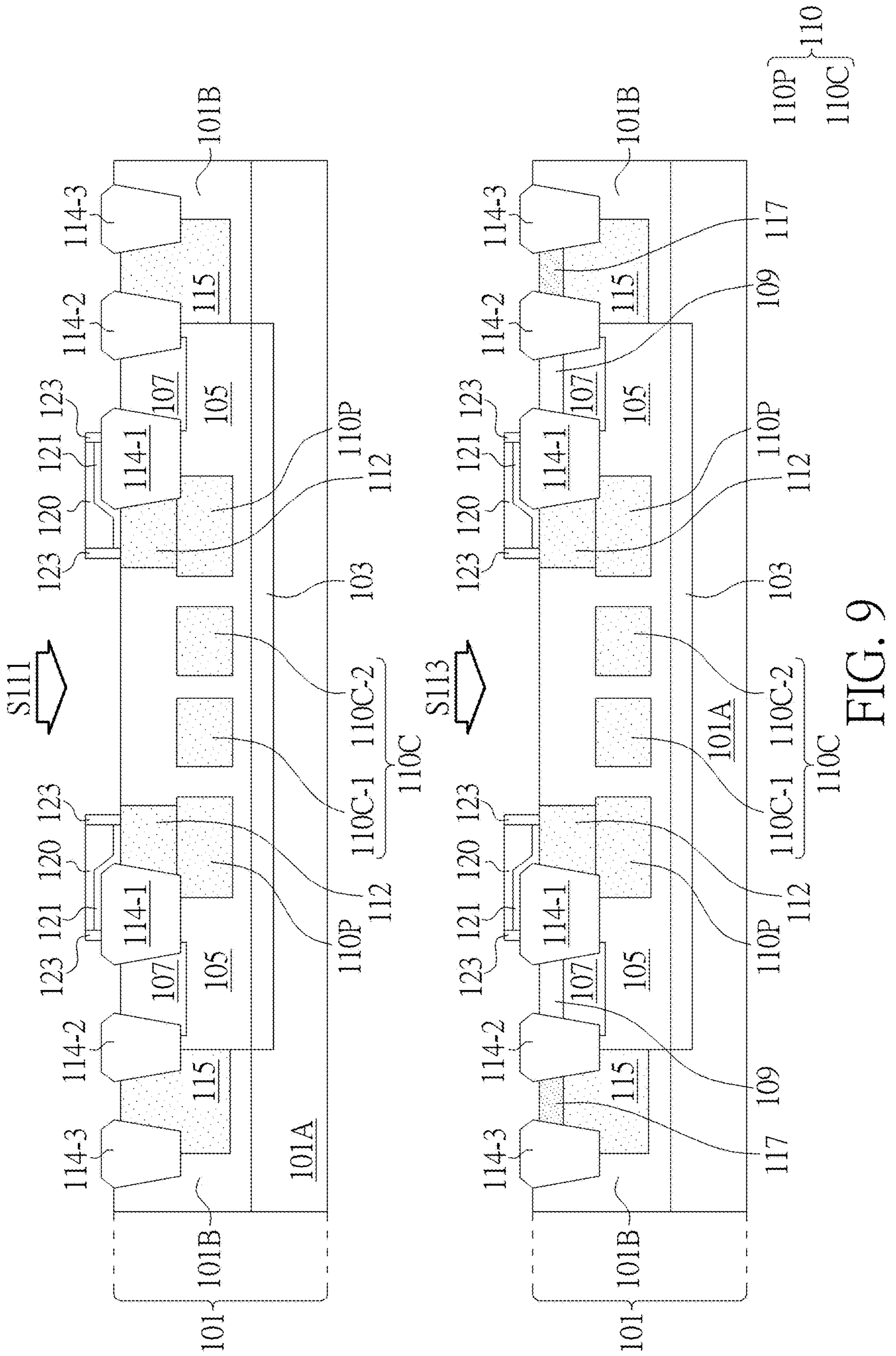

Afterwards, referring to FIG. 9, in step S111, a dielectric layer 121 and a conductive structure 120 are formed directly above the second doped region 112 and the first isolation structure 114-1 by deposition, photolithography and etching processes. In one embodiment, the composition of the dielectric layer 121 is, for example, silicon oxide, and the composition of the conductive structure 120 is, for example, polysilicon. Firstly, a silicon oxide layer and a polysilicon layer may be deposited on the substrate 101 in sequence. Then, a patterned photoresist is formed on the polysilicon layer to be used as an etching mask, and the silicon oxide layer and the polysilicon layer are etched simultaneously by using the same etching mask to form the dielectric layer 121 and the conductive structure 120. Next, a spacer material layer is conformally deposited on the surface of the substrate 101 and the conductive structure 120, and the horizontal portion of the spacer material layer is removed by an anisotropic dry etching process to form a spacer 123 on the sidewalls of both the dielectric layer 121 and the conductive structure 120. In some embodiments, the dielectric layer 121, the conductive structure 120 and the spacer 123 may be fabricated together with gate structures of other transistors.

Still referring to FIG. 9, in step S113, a first heavily doped region 109 such as an N-type heavily doped region is formed in the third doped region 107 by using a patterned mask such as a patterned photoresist and an ion implantation process. The doping concentration of the first heavily doped region 109 is higher than the doping concentration of the third doped region 107. In one embodiment, the doping concentration of the first heavily doped region 109 is, for example, about 1E13 atoms/$cm^2$ to about 1E14 atoms/$cm^2$. The first heavily doped region 109 is located between the first isolation structure 114-1 and the second isolation structure 114-2. The first heavily doped region 109 may be fabricated together with source/drain regions of other transistors. In addition, a second heavily doped region 117 such as a P-type heavily doped region is formed in the second well region 115 by using another patterned mask such as a patterned photoresist and another ion implantation process. In one embodiment, the doping concentration of the second heavily doped region 117 is, for example, about 1E13 atoms/$cm^2$ to about 1E14 atoms/$cm^2$. The second heavily doped region 117 is located between the second isolation structure 114-2 and the third isolation structure 114-3. The second heavily doped region 117 may be fabricated together with bulk regions of other transistors.

Figure 10:
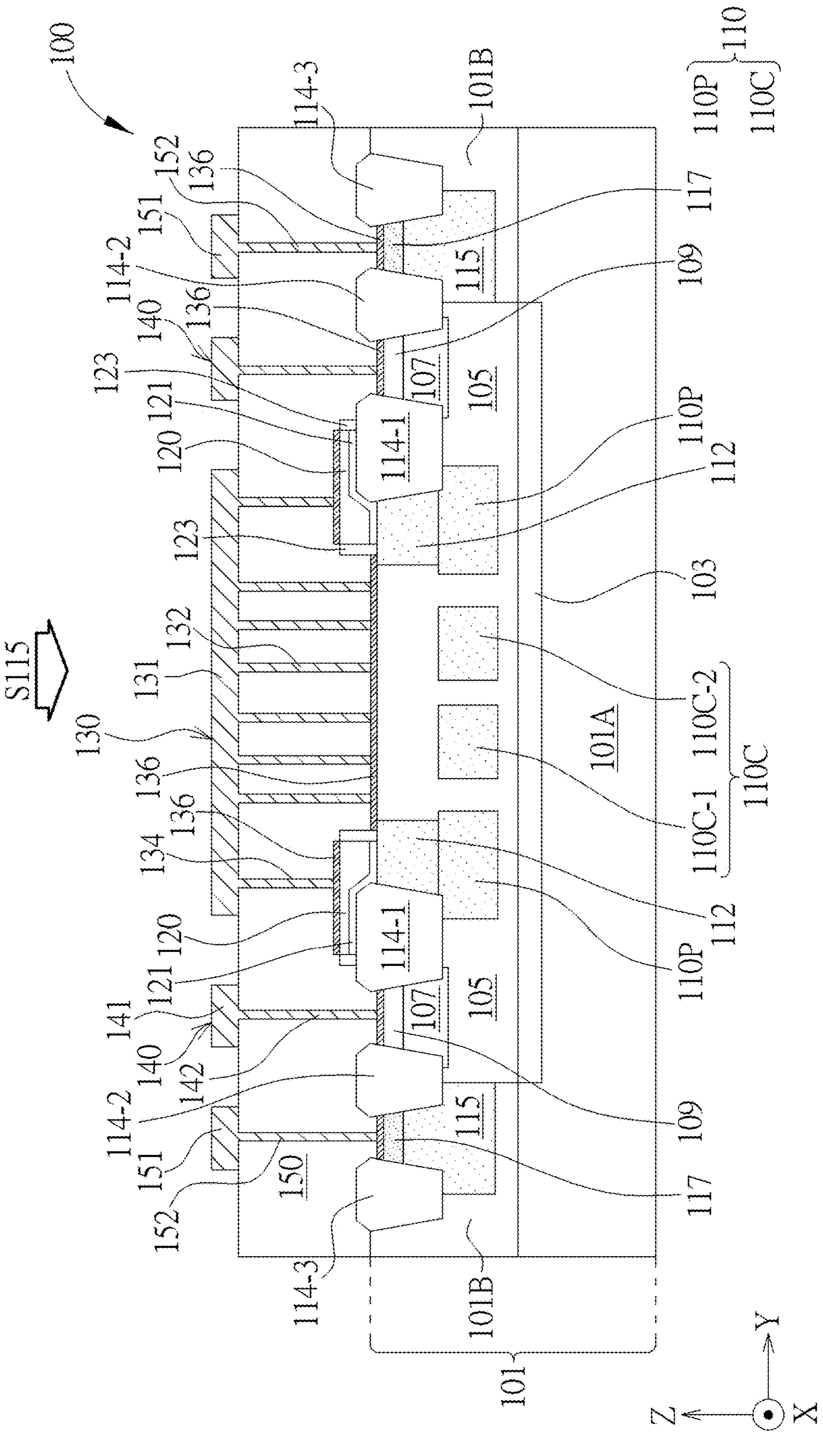

Next, referring to FIG. 10, in step S115, in one embodiment, firstly, a metal layer is deposited on the surface of the substrate 101 and the conductive structure 120, and then the metal of the metal layer is reacted with the silicon in the substrate 101 and the conductive structure 120 by a heat treatment to form a metal silicide layer 136, for example, a cobalt silicide (CoSix) layer. The metal silicide layer 136 may be formed on the surfaces of the conductive structure 120, the continuous region 105C of the first well region 105, the first heavily doped region 109 and the second heavily doped region 117, thereby reducing the contact resistance between these regions and subsequently formed conductive contacts. Afterwards, an interlayer dielectric (ILD) layer 150 is deposited on the substrate 101, and then multiple contact holes are formed in the ILD layer 150 to respectively expose the conductive structure 120, the continuous block 105C of the first well region 105, a portion of the first heavily doped region 109, and a portion of the second heavily doped region 117 by using a patterned mask and an etching process. Next, a metal material layer is deposited on the surface of the ILD layer 150 and also fills up the multiple contact holes to form multiple contact plugs 132, 134, 142 and 152. Then, the metal material layer is patterned by photolithography and etching processes to form multiple metal layers 131, 141 and 151. The metal layer 131 is connected to the contact plugs 132 and 134, and the metal layer 131 and the contact plug 132 constitute an anode electrode 130. The conductive structure 120 is electrically connected to the metal layer 131 of the anode electrode 130 through the contact plug 134. In addition, the metal layer 141 is connected to the contact plug 142 to constitute a cathode electrode 140. The metal layer 151 is connected to the contact plug 152 to be a substrate electrode. A bulk potential may be applied to the substrate 101 through the substrate electrode, the second heavily doped region 117 and the second well region 115. Thereafter, the fabrication of the semiconductor device 100 is completed.

According to some embodiments of the present disclosure, through the layout of the first doped region and the second doped region both having the second conductivity type such as the P type in the first well region having the first conductivity type such as the N type, the first well region has the continuous block at the surface of the central area of the anode end to provide more current conduction paths, thereby increasing the on-state current of the Schottky barrier diode (SBD). In addition, the first doped region and the second doped region both having the second conductivity type provide sufficient pinch effect on the off-state leakage current of the SBD, so that the off-state leakage current is within acceptable range. Moreover, through the layout of the first doped region and the second doped region, and the conductive structure disposed directly above the second doped region and electrically coupled to the anode electrode, the breakdown voltage of the SBD under reverse bias is also increased. Therefore, the overall performances of the SBD according to the semiconductor devices of the present disclosure are effectively improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:

a substrate;

a first well region, having a first conductivity type and disposed in the substrate;

a first doped region, having a second conductivity type and buried in the first well region, wherein the first doped region comprises a middle portion and a peripheral portion, and the first well region comprises a continuous block located directly above the middle portion;

a second doped region, having the second conductivity type, disposed in the first well region, and located directly above the peripheral portion of the first doped region;

a third doped region, having the first conductivity type and disposed in the first well region;

a first isolation structure, disposed in the first well region and located between the second doped region and the third doped region;

an anode electrode, disposed above the substrate and electrically connected to the continuous block of the first well region; and a cathode electrode, disposed above the substrate and electrically connected to the third doped region.

2. The semiconductor device of claim 1, wherein the second doped region surrounds the continuous block of the first well region, a bottom surface of the continuous block is in direct contact with a top surface of the middle portion of the first doped region, and a side surface of the continuous block is in direct contact with a side surface of the second doped region.

3. The semiconductor device of claim 1, wherein the second doped region is in direct contact with a top surface of the peripheral portion of the first doped region, and in a vertical projection direction, the second doped region is not overlapped with the middle portion of the first doped region.

4. The semiconductor device of claim 1, wherein the first well region comprises a portion between the middle portion and the peripheral portion of the first doped region, and the continuous block of the first well region is in direct contact with a top surface of the portion.

5. The semiconductor device of claim 1, further comprising a conductive structure and a dielectric layer disposed directly above the second doped region, wherein the dielectric layer is located between the conductive structure and the second doped region, and the conductive structure is electrically connected to the anode electrode.

6. The semiconductor device of claim 1, wherein when viewed from a top view, the peripheral portion of the first doped region comprises an annular block, the middle portion comprises an elongated block, the annular block surrounds the elongated block, and two ends of the elongated block are respectively connected to the annular block.

7. The semiconductor device of claim 6, wherein the elongated block comprises a plurality of strips, long axis directions of the plurality of strips are parallel to each other, perpendicular to each other, or a combination thereof, and two ends of each of the plurality of strips are respectively connected to the annular block.

8. The semiconductor device of claim 1, further comprising:

a second well region, having the second conductivity type, disposed in the substrate and abutting a side surface of the first well region, wherein the second well region is electrically coupled to a bulk potential; and a second isolation structure, disposed in the substrate and located between the third doped region and the second well region.

9. The semiconductor device of claim 8, wherein the second well region surrounds the first well region, and the third doped region surrounds both the first doped region and the second doped region.

10. The semiconductor device of claim 8, wherein a bottom surface of the first doped region and a bottom surface of the second well region are both higher than a bottom surface of the first well region.

11. The semiconductor device of claim 8, further comprising:

a first heavily doped region, having the first conductivity type and disposed in the third doped region, wherein the cathode electrode is in direct contact with the first heavily doped region; and a second heavily doped region, having the second conductivity type and disposed in the second well region.

12. The semiconductor device of claim 1, wherein a top surface of the second well region is higher than a top surface of the first doped region.

13. The semiconductor device of claim 1, further comprising a buried layer having the first conductivity type, disposed in the substrate, located directly below the first well region, and in direct contact with a bottom surface of the first well region.

14. The semiconductor device of claim 1, wherein compositions of the anode electrode and the cathode electrode comprise a metal, and the semiconductor device comprises a Schottky barrier diode.

15. The semiconductor device of claim 1, wherein the anode electrode is in direct contact with the continuous block of the first well region.

* * * * *